United States Patent [19]

Marancik et al.

[11] Patent Number: 5,534,219
[45] Date of Patent: Jul. 9, 1996

[54] METHOD FOR PRODUCING MULTIFILAMENTARY NIOBIUM-TIN SUPERCONDUCTOR

[75] Inventors: William G. Marancik, Watchung; Seungok Hong, New Providence, both of N.J.; Rouyi Zhou, Los Alamos, N.M.

[73] Assignee: Oxford Instruments Inc., Carteret, N.J.

[21] Appl. No.: 249,945

[22] Filed: May 27, 1994

[51] Int. Cl.⁶ .................................................. B22F 7/00
[52] U.S. Cl. ........................... 419/4; 419/3; 419/5; 419/8
[58] Field of Search ...................................... 419/3, 4, 5, 8; 505/124, 430–432, 823; 148/11.5 F; 29/599

[56] References Cited

U.S. PATENT DOCUMENTS

| | | | |
|---|---|---|---|
| 3,641,665 | 2/1972 | Matricon | 29/599 |
| 3,905,839 | 9/1975 | Hashimoto | 29/599 |
| 4,148,129 | 4/1979 | Young | 29/599 |
| 4,411,712 | 10/1983 | Marancik | 419/3 |
| 4,447,946 | 5/1984 | Marancik | 29/599 |
| 4,646,428 | 3/1987 | Marancik et al. | 29/599 |
| 4,857,675 | 8/1989 | Marancik et al. | 174/15.4 |
| 4,973,365 | 11/1990 | Ozeryansky et al. | 148/11.5 F |
| 5,081,075 | 1/1992 | Jin et al. | 505/1 |
| 5,223,478 | 6/1993 | Whitlow et al. | 505/1 |

Primary Examiner—Charles T. Jordan
Assistant Examiner—John N. Greaves
Attorney, Agent, or Firm—Klauber & Jackson

[57] ABSTRACT

A method for producing a multifilamentary superconductor containing niobium-tin ($Nb_3Sn$). A fully bonded niobium/copper composite billet is formed having a plurality of longitudinally extending channels which are symmetrically distributed with reference to transverse cross-sections of the billet, each channel being filled with an inert removable filler material. The inert filler material is removed to open the longitudinally extending channels in the billet. Tin or a tin alloy is inserted into the channels, and the niobium/copper composite billet with the inserted tin or tin alloy is cold drawn to the desired final dimensions. The drawn composite is then heated to effect in situ formation of the niobium-tin.

13 Claims, 1 Drawing Sheet

METHOD FOR PRODUCING MULTIFILAMENTARY NIOBIUM-TIN SUPERCONDUCTOR

FIELD OF THE INVENTION

This invention relates to multifilamentary intermetallic superconductors containing $Nb_3Sn$, and to methods of manufacture of same.

BACKGROUND OF THE INVENTION

One of the most desirable superconductor materials is niobium-tin ($Nb_3Sn$) because of its almost zero resistance at low temperatures. However, it is an extremely hard and brittle material and it is difficult to work with in achieving appropriately shaped and dimensioned wires or rods without discontinuity or other damage.

In order to form the wires and rods, the superconductor materials must undergo repeated compression, drawing, elongation and heating. All of such steps are however detrimental to the integrity, structure and superconducting capability of the niobium-tin material. It has accordingly been the practice to initially perform all of the compression, drawing, forming, elongation, heating and general material working with the pure, ductile, malleable, generally easily workable niobium and copper materials (the latter being used as a highly conductive substrate material). Thereafter, the less workable tin is plated or otherwise adhered to the formed rod or wire surfaces and the entire material is finally heated. Upon such heating, the tin migrates through the conductive copper substrate material to which it has been bonded, and into contact with the contained niobium, to form the requisite niobium-tin material of appropriate dimension and form, in situ.

In the bronze process, Nb rods are inserted into a drilled bronze (Copper 14% tin alloy) billet. This is evacuated, extruded and drawn into hexagonal cross section rods that are restacked into a second extrusion can. This is extruded and drawn to the final wire size and heat treated to diffuse the tin from the bronze matrix to the Nb to form $Nb_3Sn$.

The disadvantages of this process are the limited amount of tin available in the matrix and the bronze work hardens quickly and must be annealed every few die passes (about every 40% area reduction or less).

Alternatively, composite conductors can be made by combining the Nb, Cu and Sn in a billet. However, the composite billet can only be cold worked. This permits only limited bonding in the later stages of processing of the copper to copper and the copper to niobium. Such an unbonded conductor is more difficult to process and restricts the latitude one has in the billet configuration.

In accordance with the foregoing, it is an object of the present invention to provide a method for preparing a multifilamentary $Nb_3Sn$ superconductor, which enables the diffusion bonding of all the components prior to insertion of the tin or tin alloy which is subsequently reacted to form the $Nb_3Sn$.

It is a further object of the invention to provide a method for producing a multifilamentary superconductor containing niobium-tin ($Nb_3Sn$), in which multiple symmetrically distributed channels are created in a fully bonded niobium-copper billet, for insertion of tin or tin alloy; and wherein no rebundling of components is required as would result in an unbonded composite.

SUMMARY OF INVENTION

Now in accordance with the present invention, a method is provided for producing a multifilamentary superconductor containing niobium-tin ($Nb_3Sn$). Pursuant to the method a fully bonded niobium/copper composite billet is formed having a plurality of longitudinally extending channels which are symmetrically distributed with reference to transverse cross-sections of the billet, which channels are filled with an inert removable filler material. Following preparation of the fully bonded billet the inert filler material is removed, which opens the longitudinally extending channels. Tin or a tin alloy is then inserted into the channels, and the niobium/copper composite billet is cold drawn with the inserted tin or tin alloy, to the desired final dimensions. The drawn composite is then subjected to heat treatment to effect in situ formation of the niobium-tin.

The inert filler material can comprise a water soluble material such as a salt which is thus removable by application of water; or can comprise other inert filler material which is removed by application of a solvent in which the material is soluble. In a typical procedure, the material can comprise sodium chloride, which is thus simply removed by use of water, e.g. as streams or jets.

In one mode of forming the fully bonded composite billet, a plurality of copper tubes are filled with the inert filler material. An unbonded billet is then assembled containing composite rods of niobium/copper among which the filled copper tubes are symmetrically distributed. The unbonded billet is then subjected to bonding conditions adequate to form the fully bonded composite billet containing the inert filler material. Both the copper tubes and the composite rods of the unbonded billet may have a hexagonal cross-section to assure good packing in the assembled unbonded billet. The bonding conditions may be brought about by compacting and hot extruding the unbonded billet; or by subjecting the unbonded billet to hot isostatic pressing.

In a further mode of forming the fully bonded composite billet, a plurality of rods are formed, each comprising a niobium cylinder having a central channel filled with said inert filler material, and surrounded by a concentric copper cylinder. The rods are hexed and disposed in side by side relation in a copper can to form the assembled unbonded billet. The unbonded billet is then subjected to bonding conditions adequate to form the fully bonded composite billet. The bonding conditions may be brought about by compacting and hot extruding the unbonded billet; or by subjecting the unbonded billet to hot isostatic pressing.

DESCRIPTION OF PREFERRED EMBODIMENT

Generally the present invention comprises a method for the production of niobium-tin multifilamentary superconductors of desired size with substantially symmetric or uniform distribution of niobium-tin superconductor material throughout the cross-section of the superconductor.

In accordance with the present invention a removable inert (to copper, tin and niobium, and to extrusion heating) filler material, most preferably an inert salt which is soluble in water or a composition which is soluble in other convenient solvent, and capable of withstanding extrusion and drawing or pressing procedures, is distributed along the length of a niobium/copper composite billet in a symmetrical cross-sectional distribution. After completion of the extrusions and drawings to appropriate size or of other procedure such as hot isostatic pressing, which effect bonding among the metal components, the inert filler material is removed (such as with jets of a solvent for the salt, e.g. water jets for sodium chloride filler salt), without disruption of the spaces which it filled. This leaves a fully bonded niobium/copper composite billet with very uniform channels or holes distributed through the matrix. Tin rods or filaments are then inserted into the emptied spacings and the billet or rod is cold drawn to final size and then heated to cause in situ uniform distribution formation of the niobium-tin with the appropriate superconductor configuration and dimensions.

Figure 1:
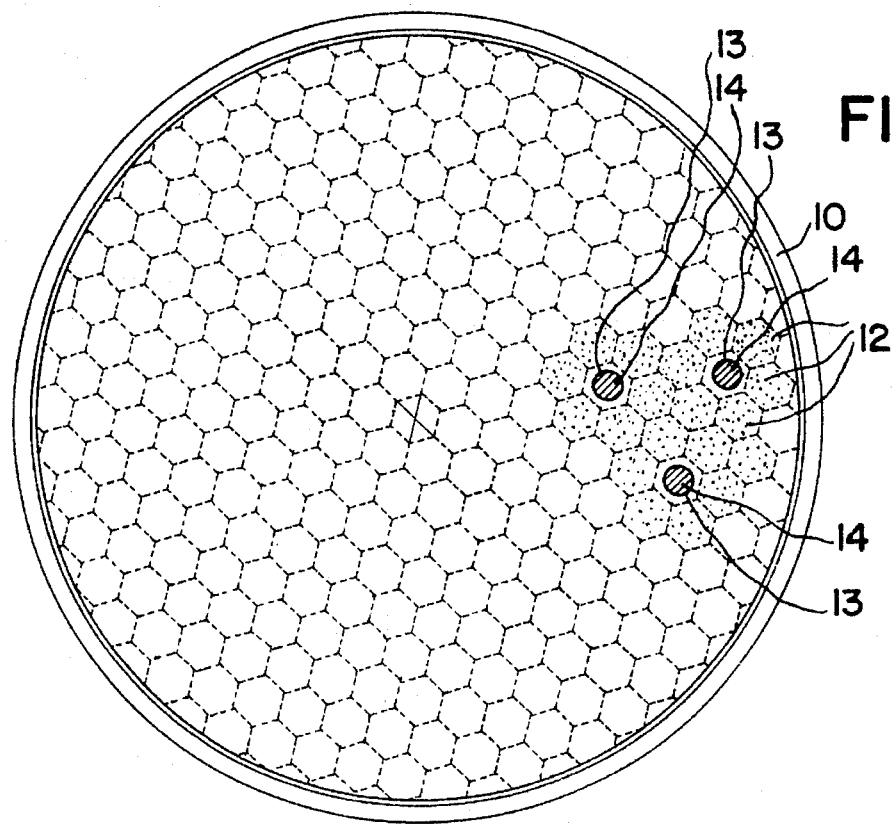
FIG. 1 schematically depicts in practice of the invention, an open end view of an initially assembled unbonded billet including a copper can in which are packed hexed rods of multi-filament niobium containing copper, and removable salt-filled hexed copper tubes.

With specific reference to the drawings, in FIG. 1 a typical six inch (15.2 cm) copper billet can 10 is shown as being filled with hexed rods 12 of solid niobium-copper formed from extruded multifilament niobium in copper, and hexed tubes of copper 13 having a sodium chloride salt filler 14 contained therein. The rods 12 and tubes 13 are of substantially equal dimensions. For uniform distribution, the hexed tubes of copper with sodium chloride filler are uniformly or symmetrically distributed through the billet can. In processing, the billet can is sealed and evacuated and then compacted and hot extruded to about a three inch diameter and the resultant extruded rods are cut into length of about ten feet.

Figure 2:
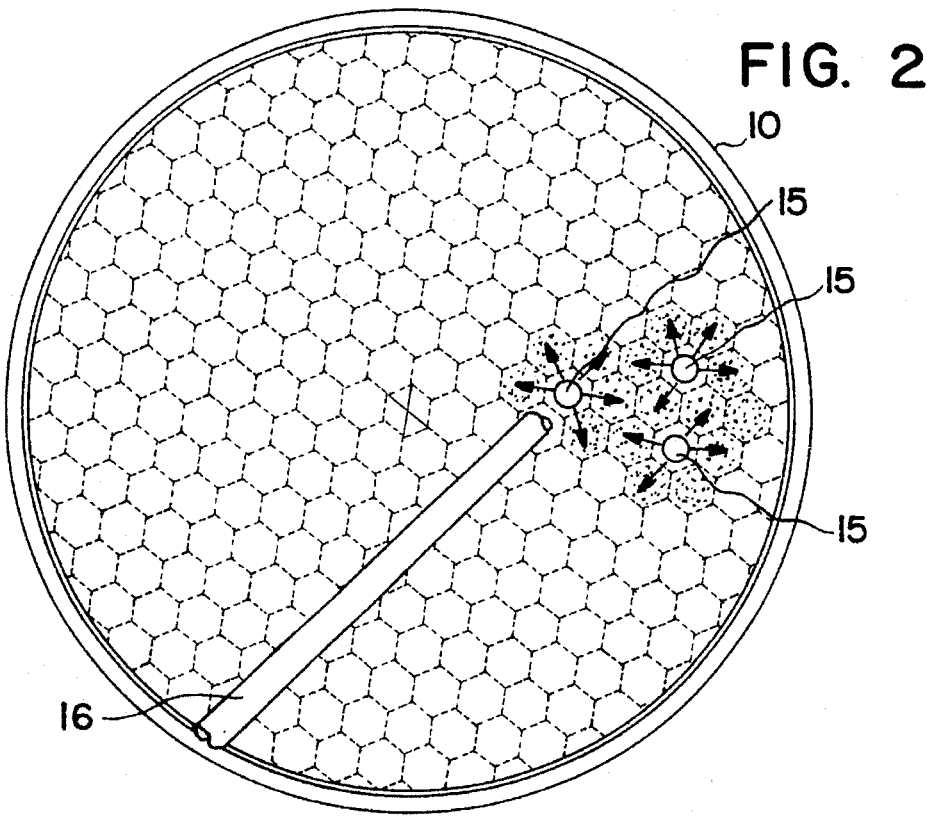
FIG. 2 is a view similar to FIG. 1, which schematically depicts in practice of the invention the salt removal from the copper tubing with the formation of longitudinally extending channels through the billet, with insertion of tin or tin alloy rods or filaments.

FIG. 2 depicts the extruded rod, with bonding between the copper and niobium having been fully effected. The sodium chloride salt filler 14 is removed from the copper tubes 13 by washing with water or other solvent which dissolves the salt filler and carries it away without disrupting the core structure of the copper tubes 13. With such salt removal, uniform elongated channels or voids 15 remain and filaments or rods of tin 16 are inserted and drawn into the voids 15, with the tubes thereafter being evacuated. A final step of cold drawing effects sufficient bonding between the tin and the copper tubing to permit facilitated tin migration through the conductive copper into contact with the niobium of the niobium-copper rods when the rod is heated. The loci of points shown as arrows in FIG. 2 depicts the uniform migration of the tin during the final step in situ formation of niobium-tin superconductor. Thereafter, about 2–10% by weight of the extruded composite is residual unreacted tin.

If desired, the copper hexes can contain single core niobium rather than multifilaments and tin rods of larger dimension can be utilized, relative to the niobium copper composite, particularly with a lower number distribution. In addition, several tin filaments of appropriate dimension can be used in placed of a single tin filament when filling the evacuated voids. Tin alloy such as a tin aluminum composite or doped tin can also be utilized in place of pure tin rods, to facilitate handling.

It is understood that the above description and drawings are illustrative of the present invention and that changes in structure, component distribution, materials and method steps may be made without departing from the scope of the present invention as defined in the following claims.

What is claimed is:

1. A method for producing a multifilamentary superconductor containing niobium-tin ($Nb_3Sn$), comprising the steps of:

forming a fully bonded niobium/copper composite billet having a plurality of longitudinally extending channels which are symmetrically distributed with reference to transverse cross-sections of the billet, each channel being filled with an inert filler material which is removable by application of a solvent in which the material is soluble;

said fully bonded billet being formed by forming an unbonded billet which includes a plurality of metallic tubes, the center channels of which are filled with said inert material, and subjecting the unbonded billet to bonding conditions adequate to form said fully bonded composite billet;

removing the inert filler material to open the longitudinally extending channels in said billet;

inserting tin, or a tin alloy, into said channels; and cold drawing the niobium/copper composite billet, with the inserted tin or tin alloy, to the desired final dimensions; and heating the drawn composite to effect in situ formation of the niobium-tin.

2. The method of claim 1, wherein said inert filler material is a water soluble salt and is removed by application of water.

3. The method of claim 2, wherein said salt is sodium chloride.

4. The method of claim 1, wherein the fully bonded composite billet is formed by the steps of:

filling a plurality of copper tubes with the inert filler material;

forming an unbonded billet containing composite rods of niobium/copper among which the filled copper tubes are symmetrically distributed; and subjecting the unbonded billet to bonding conditions adequate to form said fully bonded composite billet containing the inert filler material.

5. The method of claim 4, wherein said bonding conditions are brought about by compacting and hot extruding said unbonded billet.

6. The method of claim 4, wherein said bonding conditions are brought about by subjecting said unbonded billet to hot isostatic pressing.

7. The method of claim 4, wherein both said copper tubes and said composite rods of said unbonded billet have a hexagonal cross-section to assure good packing in said unbonded billet.

8. The method of claim 1, wherein the fully bonded composite billet is formed by the steps of:

(a) forming a plurality of rods comprising a niobium cylinder having a central channel filled with said inert filler material, and surrounded by a concentric copper cylinder;

(b) hexing the rods of step (a) and disposing same in side by side relation in a copper can to form said unbonded billet; and (c) subjecting the unbonded billet to bonding conditions adequate to form said fully bonded composite billet.

9. The method of claim 8, wherein said bonding conditions are brought about by compacting and hot extruding the unbonded billet.

10. The method of claim 8, wherein said bonding conditions are brought about by subjecting the unbonded billet to hot isostatic pressing.

11. A multifilamentary superconductor containing niobium-tin ($Nb_3Sn$) made in accordance with the method of claim 1.

12. A multifilamentary superconductor containing niobium-tin ($Nb_3Sn$) made in accordance with the method of claim 11.

13. A multifilamentary superconductor containing niobium-tin ($Nb_3Sn$) made in accordance with the method of claim 8.

* * * * *